(12) United States Patent
Heo et al.

(10) Patent No.: US 11,602,051 B2
(45) Date of Patent: Mar. 7, 2023

(54) PRINTED CIRCUIT BOARD WITH EMBEDDED BRIDGE

(71) Applicant: SAMSUNG ELECTRO-MECHANICS CO., LTD., Suwon-si (KR)

(72) Inventors: Moon Seok Heo, Suwon-si (KR); Hyung Ki Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 42 days.

(21) Appl. No.: 17/168,071

(22) Filed: Feb. 4, 2021

(65) Prior Publication Data

US 2022/0151071 A1    May 12, 2022

(30) Foreign Application Priority Data

Nov. 9, 2020   (KR) .......................... 10-2020-0148660

(51) Int. Cl.
| | |
|---|---|
| *H05K 1/14* | (2006.01) |
| *H05K 1/02* | (2006.01) |
| *H05K 1/18* | (2006.01) |
| *H05K 1/11* | (2006.01) |

(52) U.S. Cl.
CPC ........... *H05K 1/142* (2013.01); *H05K 1/0298* (2013.01); *H05K 1/115* (2013.01); *H05K 1/11* (2013.01); *H05K 1/144* (2013.01); *H05K 1/181* (2013.01); *H05K 1/185* (2013.01)

(58) Field of Classification Search
CPC ...... H05K 1/142; H05K 1/0298; H05K 1/115; H05K 3/4694; H05K 3/4682; H05K 1/11; H05K 3/4644; H05K 1/185; H05K 1/181; H05K 3/3436; H05K 3/4697; H01L 23/145; H01L 23/49816; H01L 23/5383; H01L 23/5385
See application file for complete search history.

(56) References Cited

U.S. PATENT DOCUMENTS

| | | | | |
|---|---|---|---|---|
| 8,546,698 | B2 * | 10/2013 | Naganuma ............ | H05K 1/142 174/262 |
| 9,443,824 | B1 | 9/2016 | We et al. | |
| 2013/0003314 | A1 * | 1/2013 | Igarashi ................. | H01L 24/19 29/850 |
| 2013/0223033 | A1 * | 8/2013 | Mano ..................... | H05K 1/185 336/200 |
| 2014/0118976 | A1 * | 5/2014 | Yoshikawa .......... | H05K 3/4644 361/761 |
| 2015/0257273 | A1 * | 9/2015 | Nanjo ................... | H01L 21/486 29/830 |

\* cited by examiner

*Primary Examiner* — Ishwarbhai B Patel
(74) *Attorney, Agent, or Firm* — Morgan, Lewis & Bockius LLP

(57) ABSTRACT

A printed circuit board with an embedded bridge includes: a first connection structure including a first insulating film; a bridge disposed on the first connection structure and having one surface, in contact with the first insulating film; and a second connection structure disposed on the first connection structure, and including a second insulating film. The second insulating film covers at least a portion of the other surface of the bridge.

20 Claims, 7 Drawing Sheets

PRINTED CIRCUIT BOARD WITH EMBEDDED BRIDGE

CROSS-REFERENCE TO RELATED APPLICATION(S)

This application claims benefit of priority to Korean Patent Application No. 10-2020-0148660 filed on Nov. 9, 2020 in the Korean Intellectual Property Office, the disclosure of which is incorporated herein by reference in its entirety.

TECHNICAL FIELD

The present disclosure relates to a printed circuit board with an embedded bridge in which a bridge capable of electrically connecting electronic components disposed on a printed circuit board is embedded in a printed circuit board.

BACKGROUND

With the rapid increase in the number of input/output signals and integration with the high performance of next-generation electronic products, high multilayer and high integration technologies are required in the substrate.

Accordingly, technical demands for implementing a highly integrated circuit and reducing a layer of a substrate are increased through the implementation of microcircuits. In addition, there is continuous demand to improve the process yield by implementing a highly stacked, highly integrated circuit.

SUMMARY

One of the various objects of the present disclosure is to provide a printed circuit board with an embedded bridge capable of reducing a process, even though it has a structure in which a bridge is embedded.

Another object of the present disclosure is to provide a printed circuit board with an embedded bridge capable of miniaturization through size reduction, even though it has a structure in which a bridge is embedded.

Another object of the present disclosure is to provide a printed circuit board with an embedded bridge that does not require a separate configuration of an adhesive film, even though it has a structure in which a bridge is embedded.

Another object of the present disclosure is to provide a printed circuit board with an embedded bridge that does not require separate processing of a cavity, even though it has a structure in which a bridge is embedded.

One of the various solutions proposed through the present disclosure is to implement a printed circuit board with an embedded bridge that can be relatively miniaturized and thinned, and can reduce processes at the same time more than a printed circuit board with an embedded bridge having a cavity formed therein.

According to an aspect of the present disclosure, a printed circuit board with an embedded bridge, includes: a first connection structure including a first insulating film; a bridge disposed on the first connection structure, and having one surface in contact with the first insulating film; and a second connection structure disposed on the first connection structure, and including a second insulating film. The second insulating film may cover at least a portion of the other surface, opposite to the one surface of the bridge.

According to an aspect of the present disclosure, a printed circuit board with an embedded bridge includes: a first insulating film; a bridge disposed on the first insulating film; and a second insulating film covering an upper surface of each of the first insulating film and the bridge. The upper surface of the first insulating film and a lower surface of the bridge may have a step.

According to an aspect of the present disclosure, a printed circuit board with an embedded bridge includes: an insulating layer; a first wiring layer disposed on the insulating layer; a first insulating film disposed on the insulating layer and covering the first wiring layer; a bridge disposed on the first insulating film; a second insulating film disposed on the first insulating film and covering the bridge; a second wiring layer disposed on the second insulating film; a first via extending from the second wiring layer to connect to the bridge; and a second via extending from the second wiring layer to contact the first wiring layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
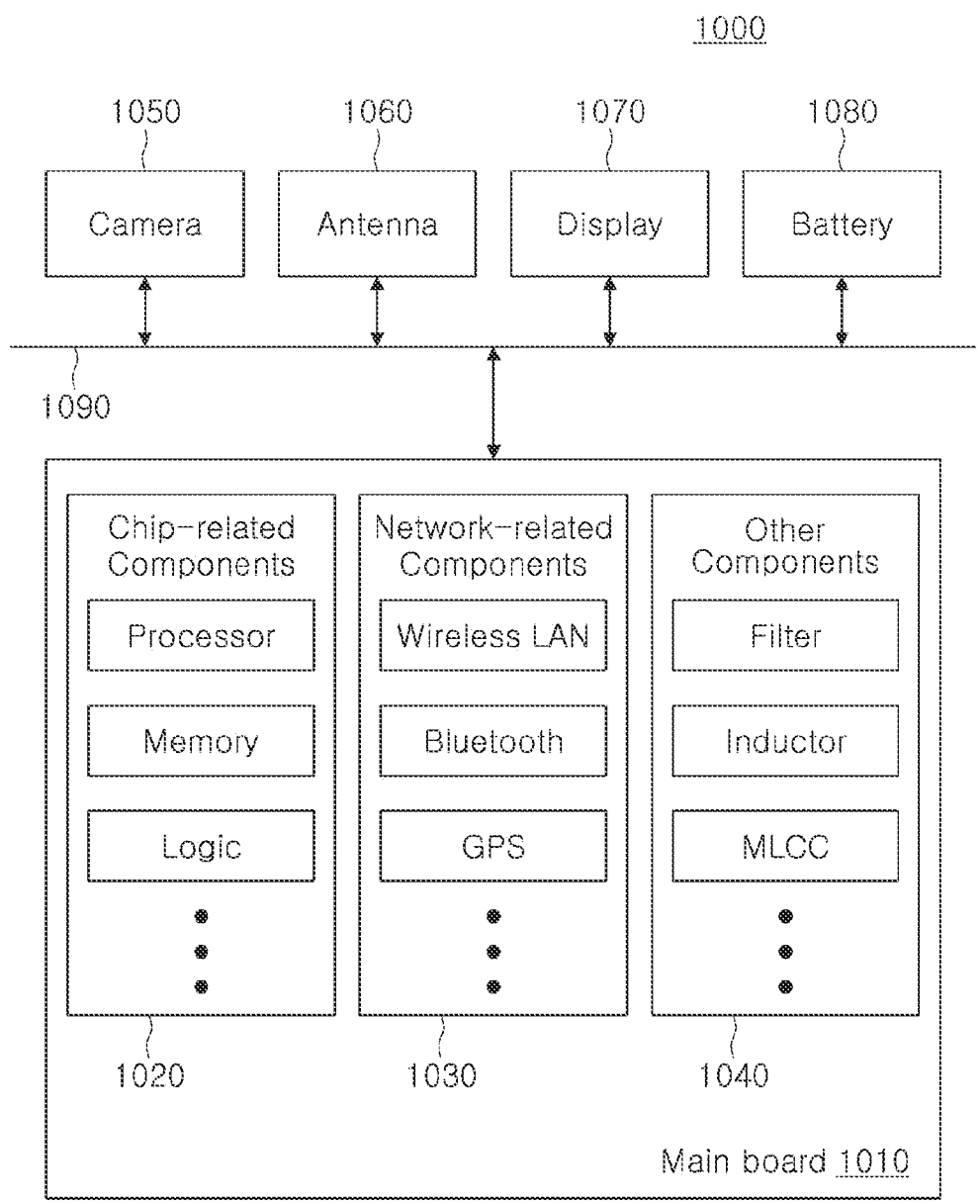
FIG. 1 is a block diagram schematically illustrating an example of an electronic device system.

Hereinafter, the present disclosure will be described with reference to the accompanying drawings. Shapes and dimensions of the elements in the drawings may be exaggerated or reduced for greater clarity of description.

FIG. 1 is a block diagram schematically illustrating an example of an electronic device system Referring to FIG. 1, an electronic device 1000 may accommodate a mainboard 1010. The mainboard 1010 may include chip-associated components 1020, network-associated components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other. The chip associated components 1020 may be in a form of a package including the above-described chip.

The network-associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-associated components 1030 are not limited thereto, and may also include a variety of other wireless or wired standards or protocols. In addition, the network-associated components 1030 may be combined with each other, together with the chip-associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
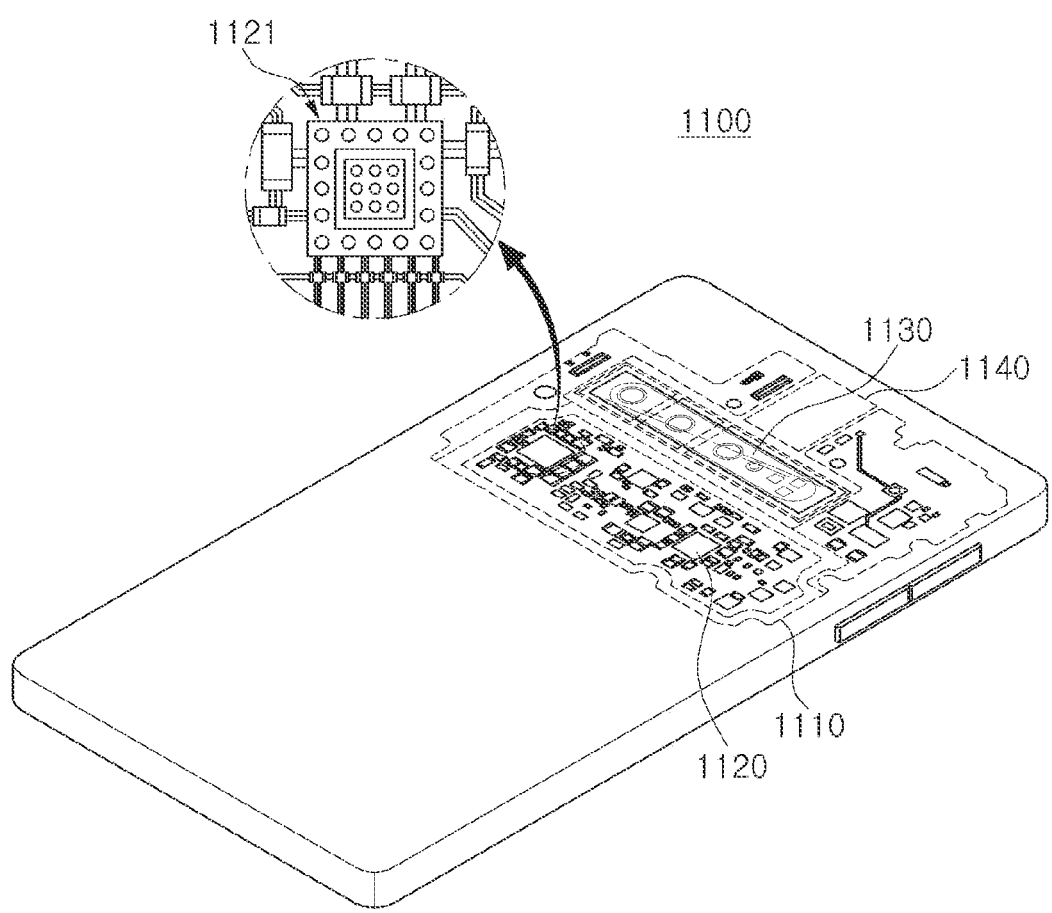
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A motherboard 1110 may be accommodated in the smartphone 1100, and various electronic components 1120 may be physically and/or electrically connected to the motherboard 1110. In addition, other electronic components that may or may not be physically or electrically connected to the motherboard 1110, such as a camera module 1130 and/or a speaker 1140, may be accommodated in the motherboard 1110. A portion of the electronic components 1120 may be chip related components, for example, electronic component embedded substrates 1121, but are not limited thereto. The electronic component embedded substrates 1121 may be in a form in which an electronic component is embedded in a multilayer printed circuit board, but is not limited thereto. Meanwhile, the electronic device is not necessarily limited to the smartphone 1100, but may be other electronic devices as described above.

Figure 3:
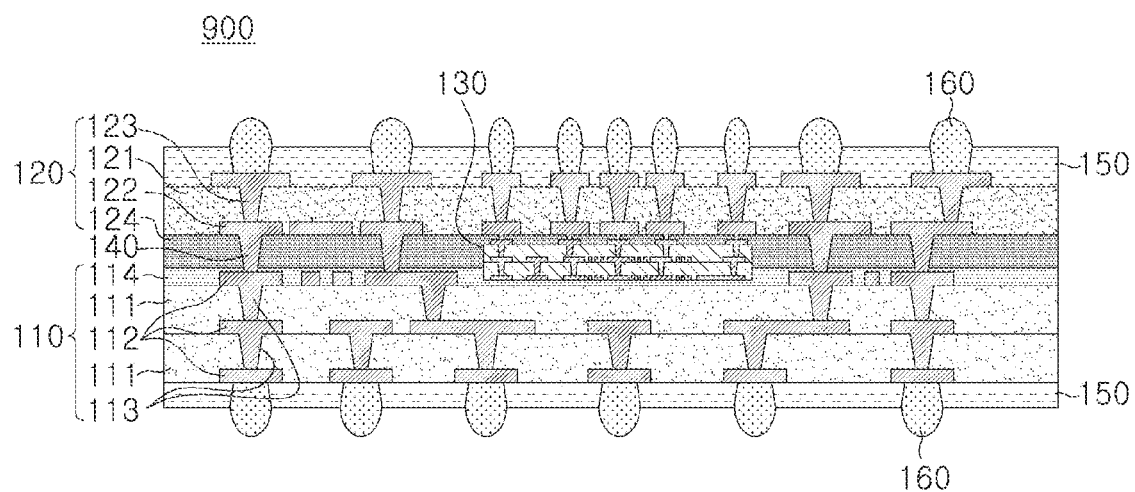
FIG. 3 is a cross-sectional view schematically illustrating a structure of a printed circuit board with an embedded bridge according to the present disclosure.

FIG. 3 is a cross-sectional view schematically illustrating the structure of a printed circuit board with an embedded bridge according to the present disclosure.

Referring to FIG. 3, a printed circuit board with an embedded bridge 900 according to an example may include a first connection structure 110, a second connection structure 120, a bridge 130, a through-via 140, a solder resist 150, and a solder ball 160.

Referring to the disclosure of FIG. 3, the printed circuit board with an embedded bridge 900 includes first and second connection structures 110 and 120 and a bridge 130.

The first connection structure 110 may include one or more first insulating layers 111, one or more first wiring layers 112 disposed on the first insulating layer 111, respectively, one or more first via layers 113 penetrating through the first insulating layer 111, respectively, and electrically connected to the first wiring layer 112, respectively, and a first insulating film 114 disposed on an outermost first insulating layer 111.

The second connection structure 120 may be connected to the first connection structure 110 through a through-via 140 and include one or more second insulating layers 121 disposed on the first connection structure 110, one or more second wiring layers 122 disposed on the second insulating layer 121, respectively, one or more second via layers 123 penetrating through the second insulating layer 121, respectively, and electrically connected to the second wiring layer 122, respectively, and a second insulating film 124 disposed on an outermost second insulating layer 121.

As a material of the first and second insulating layers 111 and 121, for example, a thermosetting resin such as an epoxy resin, a thermoplastic resin such as polyimide, or a resin impregnated with glass fiber (glass cloth, and glass fabric) together with an inorganic filler, for example, prepreg, an Ajinomoto Build-up Film (ABF), FR-4, bismaleimide triazine (BT), or the like may be used, and may include a photo imageable dielectric (PID) film, but the present disclosure is not limited thereto, and a material that can be used as a general insulating material may be used without limitations.

Metal materials may be used as materials of the first and second wiring layers 112 and 122, and as the metal materials, copper (Cu), aluminum (Al), silver (Ag), tin (Sn), gold (Au), nickel (Ni), lead (Pb), titanium (Ti), alloys thereof, or the like may be used. The first and second wiring layers 112 and 122 may perform various functions according to design. For example, the first and second wiring layers 112 and 122 may include a ground (GND) pattern, a power (PWR) pattern, a signal (S) pattern, and the like. Each of the patterns may have a line shape, a plane shape, or a pad shape. The first and second wiring layers 112 and 122 may be formed through a process such as an AP, a SAP, a MSAP, a TT, or the like, and accordingly, the first and second wiring layers 112 and 122 may include a seed layer, an electroless plating layer, and an electrolytic plating layer, formed based on the seed layer. When RCC is used as the first and second wiring layers 112 and 122, a metal foil such as copper foil may be further included on the lowermost side, and a primer resin formed on a surface of the copper foil may be further included if necessary.

Metal materials may be used as materials of the first and second via layers 113 and 123, and as the metal materials, copper (Cu), aluminum (Al), silver (Ag), tin (Sn), gold (Au), nickel (Ni), lead (Pb), titanium (Ti), alloys thereof, or the like may be used. The first and second via layers 113 and 123 may perform various functions according to design. For example, the first and second via layers 113 and 123 may include a via for ground (connection, a via for power connection, a via for signal connection, and the like. Vias of the first and second via layers 113 and 123 may be each completely filled with the metal material or may be each coated with the metal material along a wall surface of a via hole. The first and second via layers 113 and 123 may have a tapered shape. The first and second via layers 113 and 123 may have shapes tapered in a same direction. Each of the first and second via layers 113 and 123 may be formed by plating such as AP, SAP, MSAP, or TT, and may include a seed layer, an electroless plating layer, and an electrolytic plating layer, formed on the basis of the seed layer.

Figure 8:
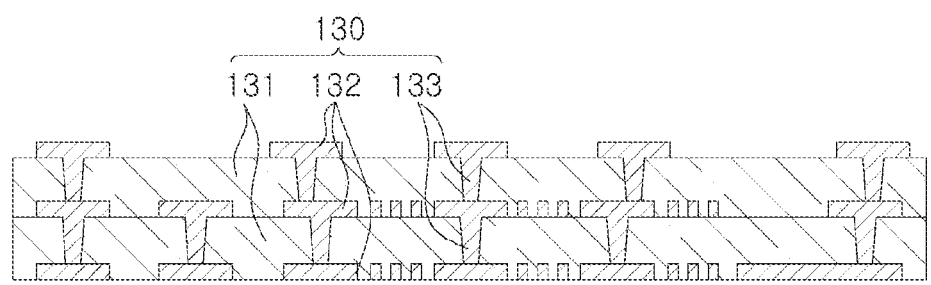
FIG. 8 is a cross-sectional view schematically illustrating the structure of a bridge in which fine circuit patterns are disposed.

The bridge 130 is embedded in the second connection structure 120 and is electrically connected to a second wiring layer 122 through the second via layer 123. With reference to FIG. 8 to be described later, the bridge 130 may include one or more organic insulating layers 131, a circuit layer 132 disposed on the organic insulating layer 131, respectively, and a connection via layer 133 penetrating through the organic insulating layer 131, respectively, and respectively connected to the circuit layer 132. The number of layers of the organic insulating layer 131, the circuit layer 132, and the connection via layer 133 may be greater or less than those shown in the drawings. The circuit layer 132 of the bridge 130 may have an average thickness and width smaller than that of the first and second wiring layers 112 and 122 of the first and second connection structures 110 and 120. Accordingly, in the case of the circuit layer 132 of the bridge 130, a relatively finer circuit pattern can be formed than the first and second wiring layers 112 and 122. In order to form a fine circuit pattern of the bridge 130, the thickness and width of the connection via layer 133 of the bridge 130 may also be smaller than that of the first and second via layers 113 and 123.

The organic insulating layer 131 of the bridge 130 may include an insulating material, and in this case, the insulating material may be, for example, a photo imageabledielectric (PID), but is not limited thereto. Boundaries of each of the layers of the organic insulating layer 131 may be separated from each other or may be unclear. When PID is used as the material of the organic insulating layer 131, the thickness of the organic insulating layer 131 can be minimized, and a photo via hole can be formed, such that the circuit layer 132 and the connection via layer 133 may be easily designed with high density.

Specifically, the thickness of each of the circuit layers 132 may be thinned more than each of the first and second wiring layers 112 and 122, and upper/lower distance thereof may be narrower. In addition, an average diameter of each connection via of the connection via layer 133 may be smaller than an average diameter of each connection via of the first and second via layers 113 and 123, and the height or thickness may also be smaller, and a pitch between vias may be narrower due to a fine pitch. Even when other materials are used as the insulating material of the organic insulating layer 131, it is desirable that the circuit layer 132 and the connection via layer 133 be formed to have higher density than the first and second wiring layers 112 and 122 and the first and second via layers 113 and 123.

The organic insulating layer 131 of the bridge 130 may include an organic material as described above, and through this, may include the same organic material as the first and second insulating films 114 and 124 surrounding the bridge 130. In the printed circuit board with an embedded bridge 900, since the bridge 130 and the first and second insulating films 114 and 124 may contain the same organic material, a mismatch problem of a coefficient of thermal expansion (CTE) between different materials may be solved, and through this, it is possible to improve a warpage problem of the entire board, and secure high reliability, and improve characteristics of parts when the printed circuit board with an embedded bridge 900 is assembled with other configurations.

The circuit layer 132 of the bridge 130 is substantially electrically connected to the second wiring layer 122 through the second via layer 123. The circuit layer 132 may perform various functions according to the design of the corresponding layer, but includes at least a signal pattern and a signal pad. The circuit layer 132 may include a conductive material such as copper (Cu), aluminum (Al), silver (Ag), tin (Sn), gold (Au), nickel (Ni), lead (Pb), titanium (Ti), or an alloy thereof, specifically, a metal material may be used.

The connection via layer 133 of the bridge 130 electrically connects circuit layers 132 formed on different layers, and as a result, the connection via layer 133 forms an electrical path in the bridge 130. Each of the connection via layers 133 may include a plurality of connection vias. The connection via of each of the connection via layer 133 may include a conductive material such as copper (Cu), aluminum (Al), silver (Ag), tin (Sn), gold (Au), nickel (Ni), lead (Pb), titanium (Ti), or an alloy thereof, specifically, may include a metal material. The connection via layer 133 may perform various functions according to the design of the corresponding layer and may include at least a signal via.

The connection via of each of the connection via layer 133 may be a filled-type via filled with a conductive material, or may be a conformal-type via in which the conductive material is formed along a wall surface of a via. The connection via of each of the connection via layer 133 may have a tapered shape in the same direction as that of each of the first and second via layers 113 and 123.

The bridge 130 may have a structure in which one surface of the first connection structure 110 is disposed to be in contact with the first insulating film 114, and at least a portion thereof is embedded in the first insulating film 114. Accordingly, at least a partial region of the bridge 130 may have a structure protruding from the first insulating film 114. In addition, as the bridge 130 is partially embedded in the first insulating film 114, the upper surface of the first insulating film 114 and a lower surface of the bridge 130, that is, one surface of the bridge 130 may have a step.

As a result, a region of the bridge 130 protruding from the first insulating film 114 may be embedded in the second insulating film 124. As a result, at least a portion of the other surface of the bridge 130 facing one surface of the bridge 130 is covered by the second insulating film 124. As described above, the first and second insulating films 114 and 124 may include the same organic material as the organic insulating layer 131 of the bridge 130. As a material of the first and second insulating films 114 and 124, a thermosetting resin such as an epoxy resin, a thermoplastic resin such as polyimide, or a resin in which these resins are mixed with an inorganic filler or impregnated with glass fibers (Glass Fiber, Glass Cloth, Glass Fabric) together with an inorganic filler, for example, prepreg, ABF (Ajinomoto Build-up Film), FR-4, BT (Bismaleimide Triazine), and the like, may be used.

As described above, when the bridge has a structure surrounded by the first and second insulating films 114 and 124, and is disposed before the first and second insulating films 114 and 124 are cured, since the bridge 130 is fixed by adhesiveness, insulation, a characteristic of the insulating film, the bridge 130 can be disposed between the first and second connection structures 110 and 120 and can be fixed without a separate adhesive layer, so that the entire board can be made thinner and miniaturized. In addition, there is no need to perform a process in which a separate cavity for embedding the bridge 130 is processed in the process, and the bridge 130 may be embedded by the first and second insulating films 114 and 124, such that it is possible to achieve an effect of simplifying the process and improving productivity. Although not shown, components other than the bridge 130 may be disposed at the same level as the bridge 130, and passive components such as capacitors and inductors may be disposed. Similar to this case, since a separate cavity process is not required, the process can be simplified and productivity can be improved.

Figure 11:
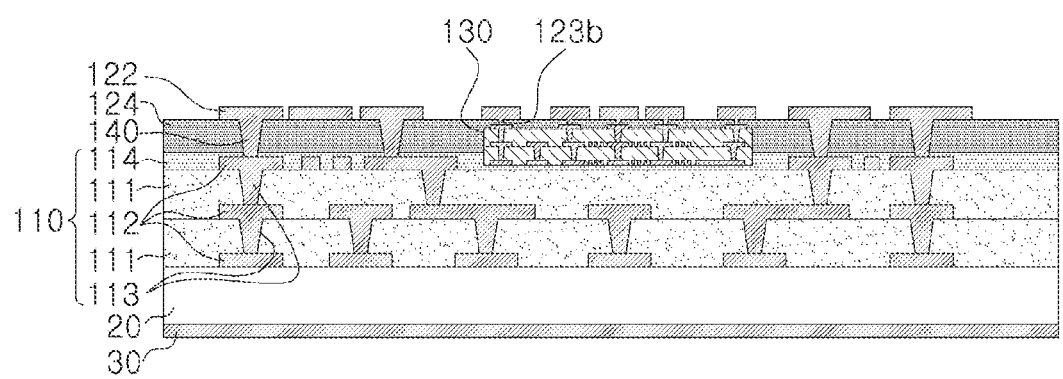
FIG. 11 is a cross-sectional view schematically illustrating a structure in which a wiring layer is disposed on the second insulating film of FIG. 10, and a through-via is formed.

The bridge 130 of this type may be electrically connected to the second wiring layer 122 of the second connection structure 120 through a fourth via 123b (shown in FIG. 11). In addition, the second wiring layer 122 of the second connection structure 120 may be electrically connected to the first wiring layer 112 of the first connection structure 110 through the through-via 140. In this case, the through-via 140 may be disposed for electrical connection between the first and second connection structures 110 and 120, and may be disposed to penetrate through at least a portion of each of the first and second insulating films 114 and 124. As a result, the bridge 130 and the first and second wiring layers 112 and 122 may be electrically connected.

Therefore, in the printed circuit board with an embedded bridge 900, the bridge 130 and/or a passive component (not shown) is embedded between the first connection structure 110 and the second connection structure 120 disposed on the first connection structure 110, and as described above, are components that are distinguished from each other, including the first and second insulating films 114 and 124, respectively, and connected by a through-via 140 at the same time. As described above, since the printed circuit board with an embedded bridge 900 includes first and second connection structures 110 and 120, which are electrical connection paths at substantially upper and lower portions, respectively, based on the bridge 130 and/or passive components (not shown), electrical connection is easy, and thus performance of electronic devices including the same can be improved.

In addition, in the printed circuit board with an embedded bridge 900, the bridge 130 is disposed on the first connection structure 110 so that one surface of the bridge 130 contacts the first connection structure 110, and thereafter, the printed circuit board with an embedded bridge 900 can be manufactured by a method of forming the second connection structure 120 covering the other surface of the bridge 130, and in this case, attachment of the bridge 130 is easy. In addition, after at least a portion of the bridge 130 is embedded in, since the second connection structure 120 can cover a region in which the bridge 130 protrudes from the first connection structure 110, process difficulty can be reduced.

Figure 12:
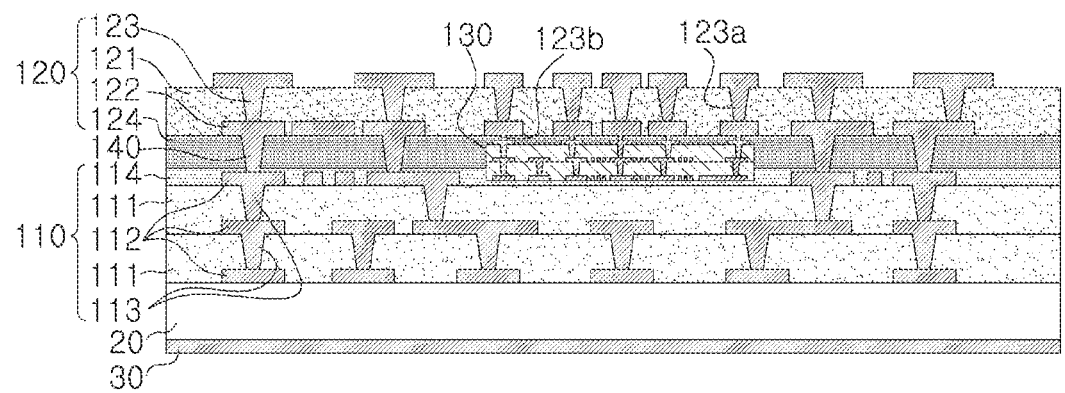
FIG. 12 is a cross-sectional view schematically illustrating a structure in which an insulating layer, a wiring layer, and a via layer are disposed on the second insulating film of FIG. 11.

Meanwhile, the first via layer 113 of the first connection structure 110 may include first and second via layers 113a and 113b (shown in FIG. 7), and the second via layer 123 of the second connection structure 110 may include a third via 123a and a fourth via 123b (shown in FIG. 12). The first via layer 113 of the first connection structure 110 may electrically connect the first wiring layers 112, and the third via 123a of the second connection structure 120 may electrically connect the second wiring layers 122. Meanwhile, the fourth via 123b of the second connection structure 120 may connect the second wiring layer 122 and the circuit layer 132 of the bridge 130. Since the bridge 130 and the second connection structure 120 are connected through the fourth via 123b, and the second connection structure 120 and the first connection structure 110 are connected through the through-via 140, and as a result, the bridge 130 and the first connection structure 110 may also be electrically connected.

The solder resist 150 may be disposed on an outer layer of each of the first and second connection structures 110 and 120. In the solder resist 150, an opening 151 (shown in FIG. 14) exposing the first and second wiring layers 112 and 122 may be formed. A solder ball 160 may be disposed in the opening 151, and the solder ball 160 may be a path for electrically connecting the first and second connection structures 110 and 120 to other elements. The solder ball 160 of FIG. 3 may be formed of a solder, or the like, such as tin (Sn)-aluminum (Ag)-copper (Cu), or the like, but this is merely an example, and a material thereof is not particularly limited thereto. The solder ball 160 may be a land, a ball, a pin, or the like. The solder ball 160 may be formed of multilayer structures or single layer structures. When the solder ball 160 is formed of multilayer structures, the solder ball 160 may include a copper pillar and a solder, and when the solder ball 160 is formed of single layer structures, the solder ball 160 may include a tin-silver solder or copper, but this is merely an example and is not limited thereto.

FIGS. 4 to 15 are process diagrams schematically illustrating a manufacturing process of a printed circuit board with an embedded bridge according to the present disclosure.

Figure 4:
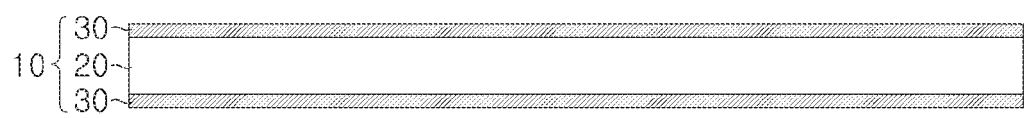
FIG. 4 discloses a structure of a carrier.
Figure 5:
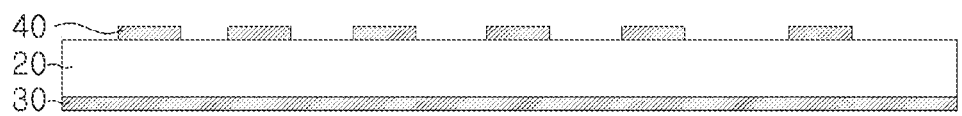
FIG. 5 discloses a structure in which the copper foil layer of the carrier of FIG. 4 is patterned.

FIG. 4 shows a structure of the carrier, and FIG. 5 shows a structure in which the copper foil layer of the carrier of FIG. 4 is patterned.

Referring to FIG. 4, first, a carrier 10 is prepared. The carrier 10 may be a detach film having a copper clad laminate (CCL) type. A copper foil layer 30 is included on the insulating material 20. The copper foil layer 30 may be patterned to be patterns 40 later becoming a wiring layer of the printed circuit board with an embedded bridge 900, and the patterning process is not limited as long as it is a conventional patterning process. For example, it may be performed that, after a photosensitive resist is disposed, the photosensitive resist is selectively removed through exposure/development, the exposed region of the copper foil layer 30 is selectively etched, and then the remaining photosensitive resist may be removed again. The wiring layer may be formed by a plating process such as AP, SAP, MSAP, or TT, and as a result, the wiring layer may include a seed layer, an electroless plating layer, and an electroplating layer formed based on the seed layer.

Figure 6:
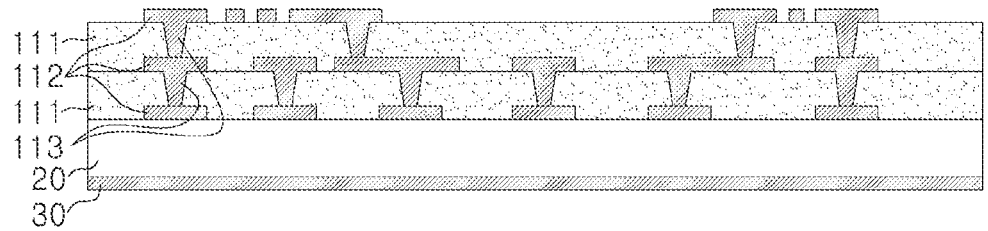
FIG. 6 is a schematic cross-sectional view illustrating a structure in which an insulating layer, a wiring layer, and a via layer are disposed on one surface of a patterned carrier.

FIG. 6 is a cross-sectional view schematically illustrating a structure in which an insulating layer, a wiring layer, and a via later are dispose on one surface of a patterned carrier.

Referring to FIG. 6, as a partial configuration of the first connection structure 110, a first insulating layer 111, a first wiring layer 112 disposed on the first insulating layer 111, and a first via layer 113 connecting the first wiring layer 112, may be disposed. The first via layer 113 may include first and second vias 113a and 113b (shown in FIG. 7). Each of the first and second via layers 113a and 113b of the first via layer 113 may be formed by a plating process, after a via hole is processed in the first insulating layer 111, using a CO2 or YAG laser, or the like. Therefore, each of the first and second vias 113a and 113b may be formed by a plating process, for example, AP, SAP, MSAP, TT, or the like, and may include a seed layer, an electroless plating layer, and an electrolytic plating layer formed based on the seed layer.

A structure of FIG. 6 discloses one or more first insulating layers 111, first wiring layers 112, and first via layers 113, and more layers of the first insulating layers 111, the first wiring layers 112, and the first via layers 113, or fewer layers of the first insulating layers 111, the first wiring layers 112, and the first via layers 113, may be disposed than those shown in FIG. 6.

Figure 7:
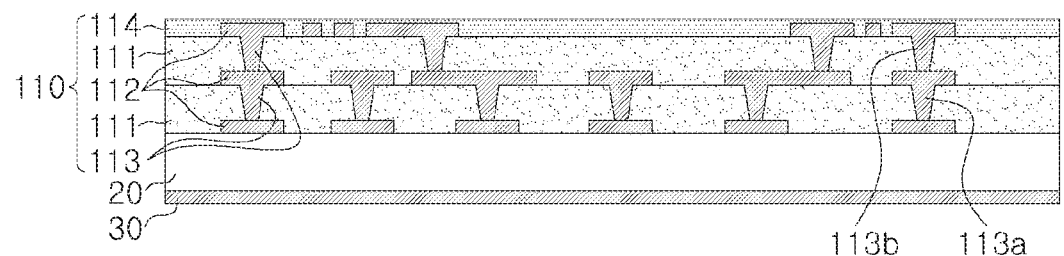
FIG. 7 is a cross-sectional view schematically illustrating a structure in which a first insulating film is disposed on the structure of FIG. 6.

FIG. 7 is a cross-sectional view schematically illustrating a structure in which a first insulating film is disposed on the structure of FIG. 6.

Referring to FIG. 7, a first insulating film 114 may be disposed on a surface, opposite to a surface on which the first insulating layer 111 contacts an insulating material 20. The first insulating film 114 covers the first wiring layer 112 disposed on an outermost layer on the opposite side of the surface of the first insulating layer 111, in contact with the insulating material 20.

As a material of the first insulating film 114, for example, a thermosetting resin such as an epoxy resin, a thermoplastic resin such as polyimide, or a resin in which these resins are mixed with an inorganic filler or impregnated with glass fibers (Glass Fiber, Glass Cloth, Glass Fabric) together with an inorganic filler, for example, prepreg, ABF (Ajinomoto Build-up Film), FR-4, BT (Bismaleimide Triazine), and the like may be used. The first insulating film 114 may be disposed on the first insulating layer 111 while covering the first wiring layer 112 in an uncured state. Therefore, while having adhesiveness, the first insulating film 114 can have some fluidity against external force. As the first insulating film 114 is disposed on the first insulating layer 111, a structure of the first connection structure 110 including the first insulating layer 111, the first wiring layer 112, the first via layer 113, and the first insulating film 114 is shown in FIG. 7.

FIG. 8 is a cross-sectional view schematically illustrating a structure of a bridge in which fine circuit patterns are disposed.

A bridge 130 may include one or more organic insulating layers 131, a circuit layer 132 disposed on the organic insulating layer 131, respectively, and a connection via layer 133 penetrating through the organic insulating layer 131, respectively, and respectively connected to the circuit layer 132. The number of layers of the organic insulating layer 131, the circuit layer 132, and the connection via layer 133 described above may be greater or less than those illustrated in FIG. 8, respectively. The circuit layer 132 of the bridge 130 may have an average thickness and width smaller than that of the first and second wiring layers 112 and 122 of the first and second connection structures 110 and 120. Accordingly, in the case of the circuit layer 132 of the bridge 130, a relatively finer circuit pattern can be formed than the first and second wiring layers 112 and 122.

In order to form a fine circuit pattern of the bridge 130, the thickness and width of the connection via layer 133 of the bridge 130 may also be smaller than that of the first and second via layers 113 and 123.

As described above, through embedding of the bridge 130 including the circuit layer 132 having a fine circuit pattern and the connection via layer 133, reliability of the electrical connection in the printed circuit board with an embedded bridge 900 is improved, and a fine structure is implemented.

Figure 9:
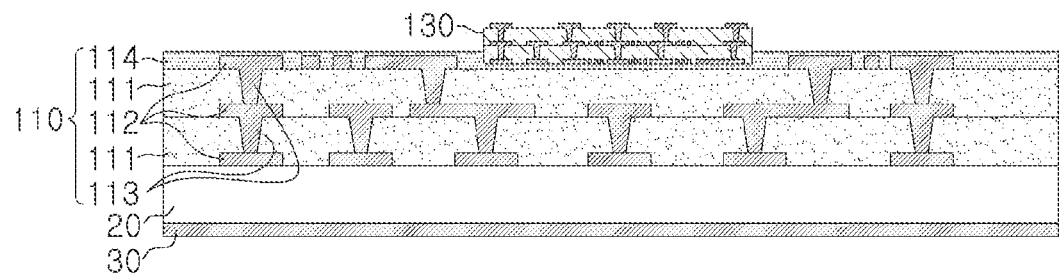
FIG. 9 is a cross-sectional view schematically illustrating a structure in which a bridge is disposed on the first insulating film of FIG. 7.

FIG. 9 is a cross-sectional view schematically illustrating a structure in which a bridge is disposed on the first insulating film of FIG. 7.

Referring to FIG. 9, a bridge 130 may be disposed in contact with the first insulating film 114. A surface in contact with the first insulating film 114 may be one surface of the bridge 130. In this case, as described above, since the first insulating film 114 is in a state before being cured and has fluidity, and a shape thereof may be partially deformed by an external force, and may have adhesiveness. Due to this adhesiveness, in the case of a printed circuit board with an embedded bridge 900 according to the present disclosure, since the first insulating film 114 is in direct contact with the bridge 130 without a separate adhesive layer, and can perform a function of fixing the bridge 130, it can be advantageous for miniaturization and thinning of the substrate.

As shown in FIG. 9, when the bridge 130 is disposed on the first insulating film 114, the bridge 130 may have a structure in which at least a portion of the bridge 130 is embedded in the first insulating film 114. Accordingly, a region of the bridge 130 that is not embedded in the first insulating film 114 will have a structure protruding from an upper surface of the first insulating film 114. In addition, as the shape of the first insulating film 114 is deformed before curing, a step may be formed on the surface of the first insulating film 114. Accordingly, the upper surface of the first insulating film 114 may have a step difference from a region in which the bridge 130 is disposed among the surfaces of the first insulating film 114. In other words, the lower surface of the bridge 130 and the upper surface of the first insulating film 114 may have a step.

Figure 10:
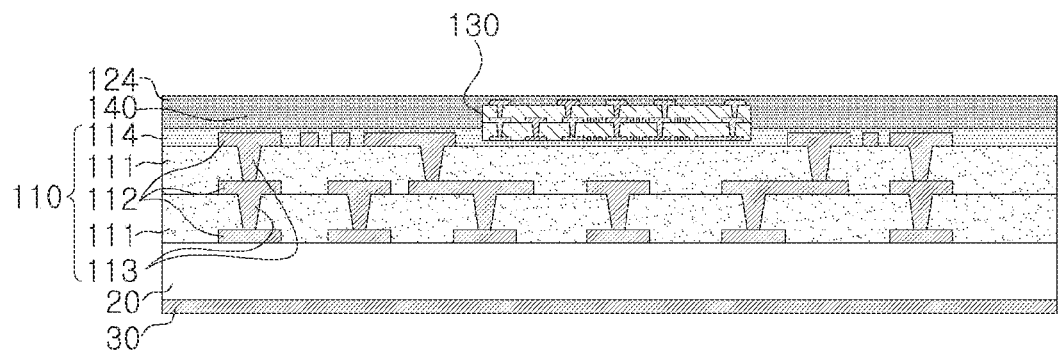
FIG. 10 is a cross-sectional view schematically illustrating a structure in which a second insulating film is disposed on the first insulating film and the bridge of FIG. 9.

FIG. 10 is a cross-sectional view schematically illustrating a structure in which a second insulating film is disposed on the first insulating film and the bridge of FIG. 9.

Referring to FIG. 10, the second insulating film 124 may be disposed on the first insulating film 114 to cover the first insulating film 114 and the bridge 130. The second insulating film 124 may include the same material as the first insulating film 114. For example, a thermosetting resin such as an epoxy resin, a thermoplastic resin such as polyimide, or a resin in which these resins are mixed with an inorganic filler or impregnated with glass fibers (Glass Fiber, Glass Cloth, Glass Fabric) together with an inorganic filler, For example, prepreg, ABF (Ajinomoto Build-up Film), FR-4, BT (Bismaleimide Triazine), and the like may be used.

The second insulating film 124 may also be disposed to cover the first insulating film 114 and the bridge 130 in a state that has not yet been cured. Therefore, it may have fluidity and adhesiveness, and may fix the bridge 130 together with the first insulating film 114. Accordingly, both the first and second insulating films 114 and 124 may directly contact the surface of the bridge 130 and perform a function of fixing the bridge 130.

After the second insulating film 124 is disposed on the first insulating film 114 as shown in FIG. 10, both the first and second insulating films 114 and 124 may be cured. In this case, the curing process of the first and second insulating films 114 and 124 may be performed in a batch.

As the curing process is performed on the first and second insulating films 114 and 124, the first and second insulating films 114 and 124 are cured while in direct contact with the bridge 130, so that the bridge 130 can be stably fixed inside the substrate.

In addition, when compared to the structure in which the bridge 130 is disposed in the cavity, in the case of the first and second insulating films 114 and 124 having fluidity in an uncured state, the bridge 130 and the first and second insulating films 114 and 124 are in close contact without the occurrence of voids, such that adhesiveness is improved and the bridge 130 can be stably fixed.

FIG. 11 is a cross-sectional view schematically illustrating a structure in which a wiring layer is disposed on the second insulating film of FIG. 10 and a through-via is formed.

Referring to FIG. 11, on the cured second insulating film 124, a structure including a through-via 140 penetrating through the first and second insulating films 114 and 124, and a fourth via 123b penetrating through at least a portion of the insulating film 124 and electrically connecting the second wiring layer 122 and the bridge 130 is shown.

The through-via 140 and the fourth via 123b may be formed by a plating process, after a via hole is processed in at least a portion of the first insulating film 114 and the second insulating film 124 using $CO_2$ or YAG laser, or the like. Accordingly, each of the through-vias 140 and the fourth via 123b may be formed by a plating process, for example, AP, SAP, MSAP, TT, or the like, and may include a seed layer, an electroless plating layer, and an electrolytic plating layer formed based on the seed layer.

The second wiring layer 122 may also be formed by a plating process, such as AP, SAP, MSAP, TT, or the like, and may include a seed layer, an electroless plating layer, and an electrolytic plating layer formed based on the seed layer. At least a portion of the second wiring layer 122 may be electrically connected to at least a portion of the first wiring layer 112 through the through-via 140, and at least the other portion of the second wiring layer 122 may be electrically connected to the circuit layer 132 of the bridge 130 through a fourth via 123b. In this case, since the fourth via 123b must be connected to the circuit layer 132 of the bridge 130 corresponding to a microcircuit pattern, and the thickness and width of the fourth via 123b may be relatively small compared to the thickness and width of the first via layer 113 and the through-via 140.

Figure 13:
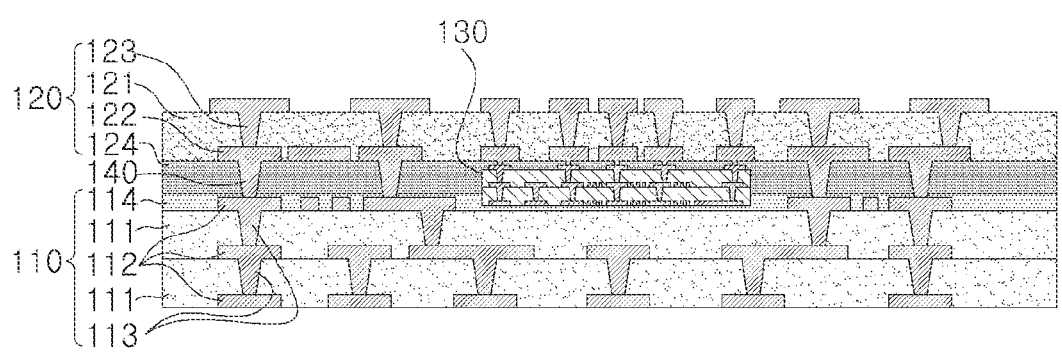
FIG. 13 is a cross-sectional view schematically illustrating a structure in which a carrier is separated from the structure of FIG. 12.

FIG. 12 is a cross-sectional view schematically illustrating a structure in which an insulating layer, a wiring layer, and a via layer are disposed on the second insulating film of FIG. 11, and FIG. 13 is a cross-sectional view schematically illustrating a structure in which carriers are separated from the structure of FIG. 12.

Referring to FIG. 12, a second insulating layer 121, a second wiring layer 122, and a second via layer 122 including a third via 123a may be disposed on the cured second insulating film 124. Therefore, the second via layer 122 may also be formed by a plating process after processing a via hole in at least a portion of the second insulating layer 121 using a $CO_2$ or YAG laser or the like. Therefore, each of the second via layer 123 may be formed by a plating process, for example, AP, SAP, MSAP, TT, and the like, and may include a seed layer, an electroless plating layer and an electrolytic plating layer formed based on the seed layer formed.

The second insulating layer 121, the second wiring layer 122, and the second via layer 122 including the third via 123a are disposed, so that if a second connection is disposed on the first connection structure 110, the carrier 10 serving as a support can be removed. In this illustration, a process in which the carrier 10 is removed after the second connection structure 120 is disposed is shown, but the carrier 10 may be removed after the first connection structure 110 is completed, that is, after the first insulating film 114 is disposed.

Figure 14:
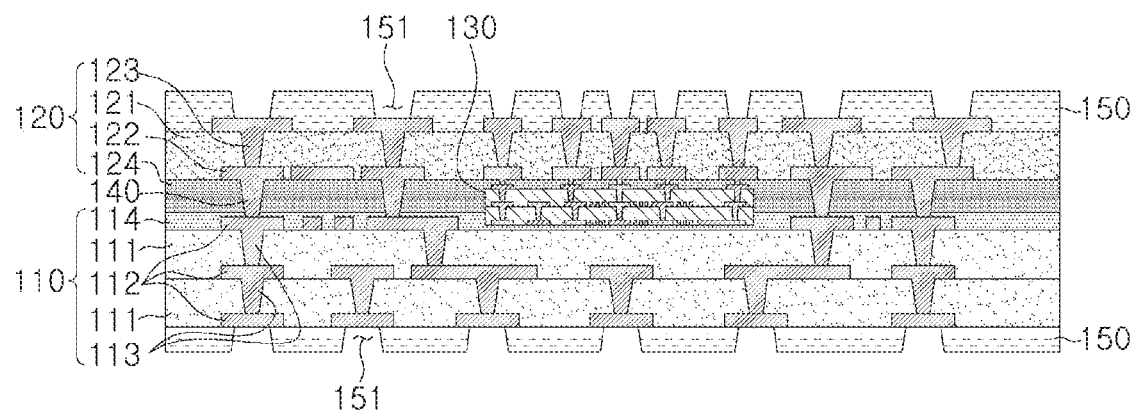
FIG. 14 is a cross-sectional view schematically illustrating a structure in which a solder resist having an opening is disposed on the structure of FIG. 13.
Figure 15:
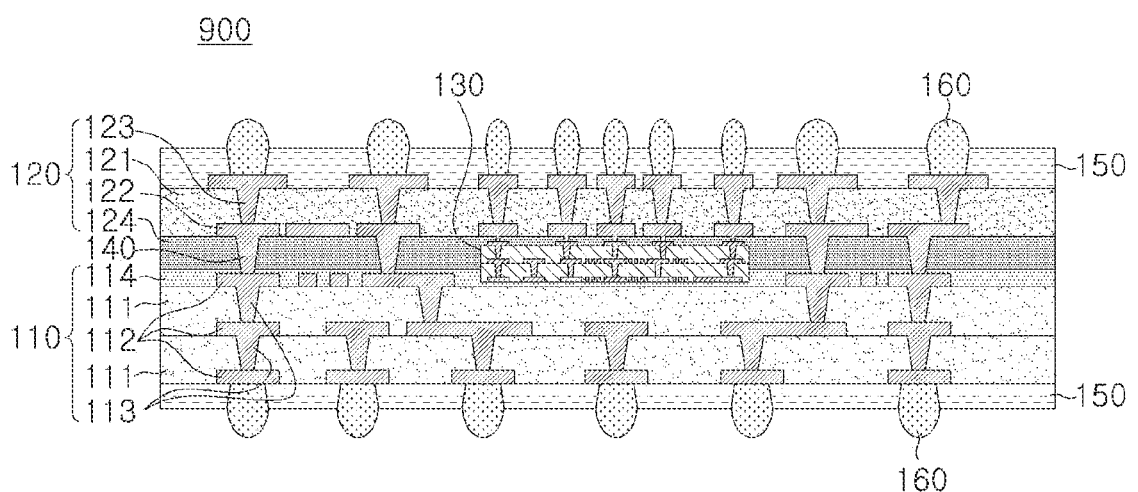
FIG. 15 is a cross-sectional view schematically illustrating the structure of the bridge-embedded substrate according to the present disclosure including solder disposed in the opening of FIG. 14.

FIG. 14 is a cross-sectional view schematically illustrating a structure in which a solder resist having an opening is disposed on the structure of FIG. 13. FIG. 15 is a cross-sectional view schematically illustrating the structure of the printed circuit board with an embedded bridge according to the present disclosure including the solder disposed in the opening of FIG. 14.

Referring to FIG. 14, a solder resist 150 may be disposed on an outermost layer of each of the first and second connection structures 110 and 120. Thereafter, an opening 151 may be formed in the solder resist 150 through a conventional processing method such as $CO_2$, YAG laser processing, or the like, to expose the first and second wiring layers 112 and 122 disposed on an outer layer of each of the first and second connection structures 110 and 120.

Thereafter, as disclosed in FIG. 15, a solder ball 160 may be disposed. The solder ball 160 may be formed of a low melting point metal, respectively, for example, a solder such as tin (Sn)-aluminum (Al)-copper (Cu), or the like, but this is merely an example, and a material thereof is not limited thereto. The solder ball 160 may be a land, a ball, a pin, or the like. The solder ball 160 may be formed as multilayer structures or single layer structures. When the solder ball 160 is formed of multilayer structures, the solder ball 160 may include a copper pillar and a solder. When the solder ball 160 is formed of a single layer structure, the solder ball 160 may include a tin-silver solder or copper (Cu), but this is merely an example, but the present disclosure is not limited thereto.

Other details are substantially the same as the printed circuit board according to the first embodiment and/the second embodiment, and detailed descriptions of overlapping details will be omitted.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of the various effects of the present disclosure, it is possible to provide a printed circuit board with an embedded bridge capable of reducing a process, even though it has a structure in which a bridge is embedded.

As another of the various effects of the present disclosure, it is possible to provide a printed circuit board with an embedded bridge capable of miniaturization through size reduction, even though it has a structure in which a bridge is embedded.

As another of the various effects of the present disclosure, it is possible to provide a printed circuit board with an embedded bridge that does not require a separate configuration of an adhesive film, even though it has a structure in which a bridge is embedded.

As another of the various effects of the present disclosure, it is possible to provide a printed circuit board with an embedded bridge that does not require separate processing of a cavity, even though it has a structure in which a bridge is embedded.

While exemplary embodiments have been shown and described above, it will be apparent to those skilled in the art that modifications and variations could be made without departing from the scope of the present invention as defined by the appended claims.

What is claimed is:

1. A printed circuit board with an embedded bridge, comprising:
   a first connection structure including a first insulating film;
   a bridge disposed on the first connection structure, and having one surface in contact with the first insulating film; and
   a second connection structure disposed on the first connection structure, and including a second insulating film disposed directly on the first insulating film in a stacking direction,
   wherein the second insulating film covers at least a portion of another surface of the bridge, opposite to the one surface of the bridge, and
   wherein the first and second insulating films define an interface therebetween which overlaps the bridge in a direction perpendicular to the stacking direction.

2. The printed circuit board with an embedded bridge of claim 1, wherein at least a portion of the bridge is embedded in the first insulating film.

3. The printed circuit board with an embedded bridge of claim 2, wherein a region of the bridge protruding from the first insulating film is embedded in the second insulating film.

4. The printed circuit board with an embedded bridge of claim 1, wherein the bridge comprises an organic insulating layer, a circuit layer disposed on the organic insulating layer, and a connection via layer penetrating through the organic insulating layer and connected to the circuit layer.

5. The printed circuit board with an embedded bridge of claim 4, wherein at least a portion of the circuit layer is exposed through the second insulating film.

6. The printed circuit board with an embedded bridge of claim 5, wherein the first connection structure further comprises a first wiring layer, a first via layer connected to the first wiring layer, and a first insulating layer on which the first wiring layer is disposed and in which the first via layer is disposed,
   wherein the second connection structure further comprises a second wiring layer, a second via layer connected to the second wiring layer, and a second insulating layer on which the second wiring layer is disposed and in which the second via layer is disposed.

7. The printed circuit board with an embedded bridge of claim 6, wherein the first insulating film is disposed on the first insulating layer, and the second insulating layer is disposed on the second insulating film.

8. The printed circuit board with an embedded bridge of claim 6, wherein the first insulating film covers at least a portion of the first wiring layer.

9. The printed circuit board with an embedded bridge of claim 6, wherein the second wiring layer is connected to the bridge through the second via layer.

10. The printed circuit board with an embedded bridge of claim 6, further comprising a through-via penetrating through at least a portion of each of the first and second insulating films and connecting the first and second wiring layers.

11. The printed circuit board with an embedded bridge of claim 6, further comprising a solder resist layer disposed on the second connection structure, and having an opening exposing at least a portion of the second wiring layer.

12. The printed circuit board with an embedded bridge of claim 11, further comprising a solder disposed in the opening.

13. A printed circuit board with an embedded bridge, comprising:
a first insulating film;
a bridge disposed on the first insulating film; and
a second insulating film covering an upper surface of the first insulating film and the bridge, respectively,
wherein the upper surface of the first insulating film, directly contacting a side surface of the bridge in a direction perpendicular to a thickness direction of the bridge, and a lower surface of the bridge define a step, and
wherein the first and second insulating films define an interface therebetween which overlaps the bridge in the direction perpendicular to the thickness direction.

14. The printed circuit board with an embedded bridge of claim 13, wherein at least a portion of the second insulating film is in contact with the side surface of the bridge.

15. The printed circuit board with an embedded bridge of claim 13, further comprising:
a first insulating layer disposed on the first insulating film;
a second insulating layer disposed on the second insulating film;
first and second wiring layers respectively disposed on the first and second insulating layers; and
first and second via layers respectively connected to the first and second wiring layers,
wherein the second wiring layer is connected to the bridge through the second via layer.

16. The printed circuit board with an embedded bridge of claim 15, further comprising a through-via penetrating through each of the first and second insulating films, and connecting the first wiring layer and the second wiring layer.

17. A printed circuit board with an embedded bridge, comprising:
an insulating layer;
a first wiring layer disposed on the insulating layer;
a first insulating film disposed on the insulating layer and covering the first wiring layer;
a bridge disposed on the first insulating film;
a second insulating film disposed directly on the first insulating film in a stacking direction and covering the bridge;
a second wiring layer disposed on the second insulating film;
a first via extending from the second wiring layer to connect to the bridge; and
a second via extending from the second wiring layer to contact the first wiring layer,
wherein the first and second insulating films define an interface therebetween which overlaps the bridge in a direction perpendicular to the stacking direction.

18. The printed circuit board with an embedded bridge of claim 17, wherein at least a portion of the bridge is embedded in the first insulating film.

19. The printed circuit board with an embedded bridge of claim 18, wherein a region of the bridge protruding from the first insulating film is embedded in the second insulating film.

20. The printed circuit board with an embedded bridge of claim 17, wherein a thickness of the first via is less than a thickness of the second via.

\* \* \* \* \*